United States Patent [19]

Bauer

[11] Patent Number: 5,832,438
[45] Date of Patent: Nov. 3, 1998

[54] APPARATUS AND METHOD FOR AUDIO COMPUTING

[75] Inventor: Robert M. Bauer, Shirely, Mass.

[73] Assignee: Sun Micro Systems, Inc., Mountain View, Calif.

[21] Appl. No.: 388,635

[22] Filed: Feb. 8, 1995

[51] Int. Cl.[6] .................................................. H03G 5/00
[52] U.S. Cl. .............................. 704/270; 381/88; 381/98; 381/123; 381/103
[58] Field of Search ................................. 381/24, 90, 188, 381/88, 96, 98, 119, 123, 25, 77, 78, 103; 395/2, 2.1, 2.4, 2.67, 2.77; 704/201, 231, 258, 270

[56] References Cited

U.S. PATENT DOCUMENTS

| | | | |
|---|---|---|---|
| 4,503,554 | 3/1985 | Davis | 381/28 |
| 5,040,221 | 8/1991 | Edwards et al. | 381/194 |
| 5,170,081 | 12/1992 | Adachi et al. | 381/94 |
| 5,172,358 | 12/1992 | Kimura | 381/102 |
| 5,297,231 | 3/1994 | Miller | 395/2.1 |
| 5,361,381 | 11/1994 | Short | 381/24 |
| 5,481,616 | 1/1996 | Freadman | 381/90 |
| 5,519,572 | 5/1996 | Luo | 381/88 |
| 5,574,792 | 11/1996 | Konno | 381/103 |

FOREIGN PATENT DOCUMENTS

| | | | |
|---|---|---|---|
| 1-72607 | 3/1989 | Japan | 381/74 |

OTHER PUBLICATIONS

Advertisement for Toshiba T6600C Series Portible computer from p. 3 of the Apr. 1994 New Media magazine, published by HyperMedia Communications Inc. San Mateo, CA.

Statement contained in the *Information Disclosure Statement* for this application that stand–alone speakers with base boost and notch filters have been made available to the public before the present invention.

Statement contained in the *Information Disclosure Statement* for this application that the prior art has included computers with speakers inside them.

CDB4231/4248—CS4231/4248 Evaluation Board, Crystal Semiconductor Corporation, DS111DB6 pp. 57–75, Mar. 1994.

Byerly et al., "LM380 Power Audio Amplifier", National Semiconductor, AN69–1–AN69–7, Dec. 1972.

*Primary Examiner*—Daniel S. Hunter
*Attorney, Agent, or Firm*—Edward W. Porter

[57] ABSTRACT

A computer for handling audio signals includes, within one box, programmable digital processing circuitry, read/write memory, digital-to-analog circuitry, one or more speakers, and an equalization element for altering the frequency response of signals applied to the speaker. The equalization element can be used to boost low frequency signals sent to the speaker if the speaker has poor low frequency response. Preferably the computer also has headphone and line-out jacks to which it supplies un-equalized audio outputs. The computer's internal speaker can be driven by a bridge mode amplifier, and, to save space, the speaker's electro-magnetic transducer can be placed in the concave recess formed by its speaker cones. The computer can have two speakers to play stereo. Preferably the computer receives analog inputs, such as from a built-in CD-ROM drive, a mike-in jack, and a line-in jack, and uses an analog-to-digital converter to digitizes these signals so they can be digitally manipulated by the computer. The computer preferably has a devices for selectively supplying the analog output from its digital-to-analog circuitry to either its internal speaker, headphone jack, or line-out jack. All of the computer's audio electronics can be placed on its motherboard, or they can be placed on a daughter board which plugs into the motherboard.

12 Claims, 6 Drawing Sheets

FIG. 5 under # 5,832,438

APPARATUS AND METHOD FOR AUDIO COMPUTING

FIELD OF THE INVENTION

The invention relates to apparatus and methods for use in computers which perform audio functions, such as, for example, the recording, processing, and playback of audio signal.

BACKGROUND OF THE INVENTION

There has been a recent trend to multimedia computing where the inputs of the computers are more than just text or still diagrams and drawings. Multimedia computing systems are often connected to microphones and audio speakers so they can record and playback sounds. Many have CD-ROM drives so they can play interactive multimedia works which include sounds, still pictures, animation, and moving video. Some of these CD-ROM drives can also play traditional audio CDs.

One of the problems confronting the makers of computing systems is that of space. In the computer field smaller is usually better. Users generally do not want desk top computer that take up a large portion of their desk. And increasingly they are using even smaller computers, such as laptop and notebook computers. Unfortunately, the small speakers which fit in small computers tend to have a poor frequency response, particularly at the lower frequencies of the audible range.

Another problems is that users often have many different potential uses for a computer's audio capabilities. Some want to record sounds from a microphone, others from a CD, others from a radio, and yet others from a tape or video recorder. On the output side, some want to play audio over speakers without having to wire up external speakers. Others might want to record the audio to a tape recorder, the audio track of a video recorder, or an external amplifier which drives external speakers. In the past many computers which have audio-in and audio-out capabilities cannot directly support all of these different types of devices. In addition, with most prior audio computers the user has to manually connect and disconnect different audio input and output devices to select which of them are to be used at any given time.

SUMMARY OF THE INVENTION

The present invention provides methods and apparatus for use in computers which handle audio signals.

One aspect of the invention relates to a computer system which includes, within one box, programmable digital processing circuitry, read/write memory, digital-to-analog circuitry, one or more speakers, and an equalization element. The equalization element is for altering the frequency response of the signal applied to the speaker. In many embodiments of the invention, this equalization element boosts the low end of the audible frequency range relative to the mid-range to compensate for the fact that most small, thin speakers of the type which would best fit into most such computers reproduce low frequencies more poorly than mid-range frequencies.

In a preferred embodiment the computer also has headphone and line-out jacks to which it supplies un-equalized audio outputs. Preferably the computer's internal speaker will be driven by a bridge mode amplifier to allow it to have a maximum voltage given the power voltages available on the computer. In many embodiments, the computer has two speakers and can play back stereo signals. It is preferred that the computer can receive analog inputs, such as from a built-in CD-ROM drive, a mike-in jack, and a line-in jack, and that the computer have analog-to-digital conversion circuitry for converting such analog signals to a digital form which can be read and processed by the computer. In some embodiments, each of the computer's built-in speakers has its electro-magnetic transducer placed in the recess formed in front of its concave speaker cone to save space.

According to another aspect of the invention, a computer has analog-to-digital circuitry which receives signals from a line-in jack and a mike-in jack. This computer also has devices for selectively supplying the analog output of its digital-to-analog converter to an internal speaker, a headphone jack, or a line-out jack. This gives the computer the ability to function as a flexible audio computer capable of receiving and outputting from and to most audio devices. It also makes it easy for the user to leave the system's built in speaker hooked up, its headphone output connected to headphones, and its line-out jack connected to an external electronic device, without the need to connect or disconnect such devices to determine which of them should receive audio output.

In one preferred embodiment of the invention, all of the computer's audio electronic circuitry is on the computer's motherboard. This makes it possible for the system to provide such audio electronics at a lower cost. In another embodiments all of the audio electronics are on a daughter board which plugs into the motherboard, allowing the system to be sold without audio electronics for those who have no use for them.

BRIEF DESCRIPTION OF THE DRAWINGS

These and other aspects of the present invention will become more evident upon reading the following description of the preferred embodiment in conjunction with the accompanying drawings, in which.

DETAILED DESCRIPTION OF THE INVENTION

Figure 1:
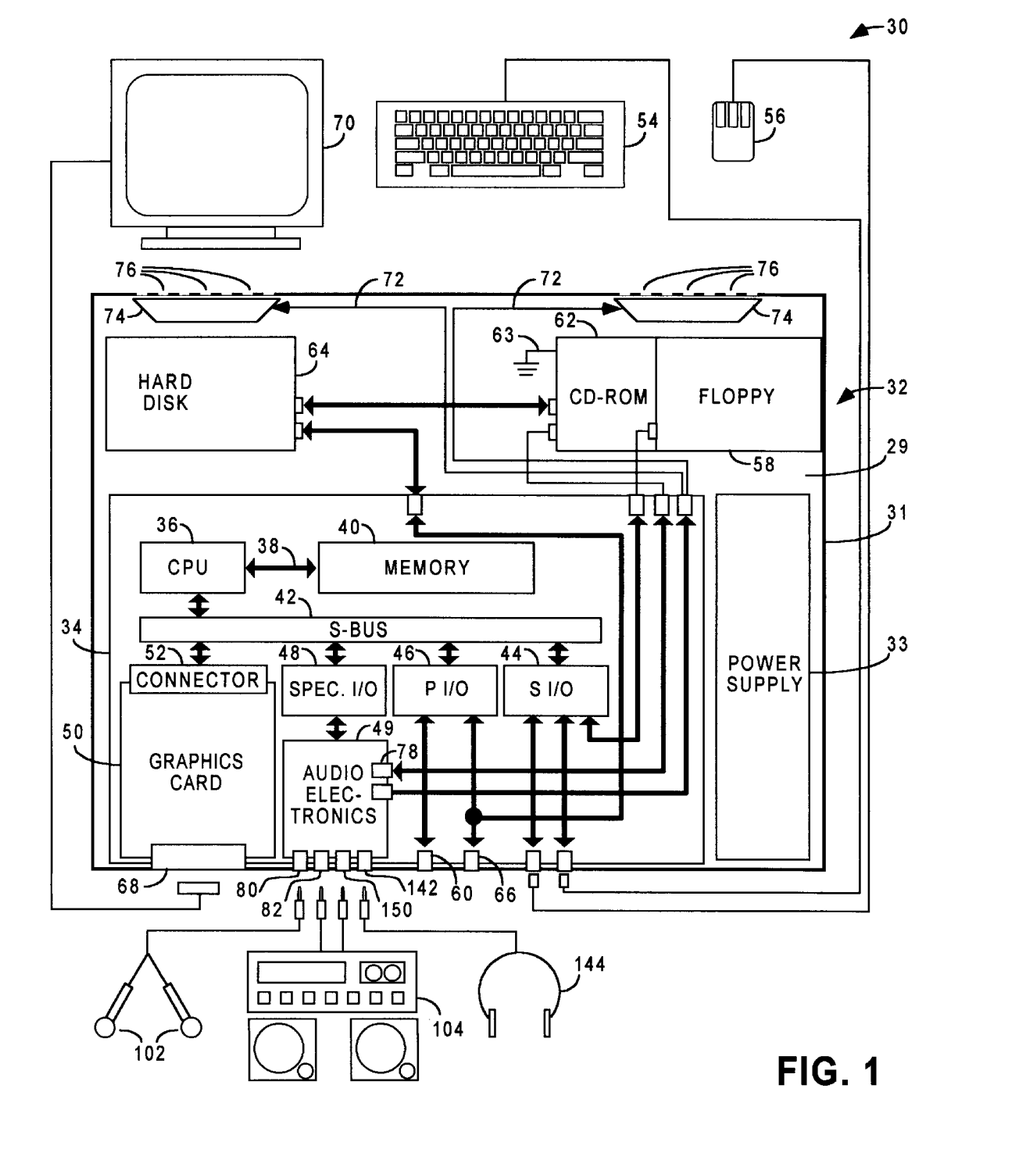
FIG. 1 is a schematic diagram of a computer system and its input and output devices, including audio input and output devices, with a simplified block diagram of its major circuitry.

Referring now to FIG. 1, a computer system 30 is shown which embodies the present invention. The computer shown is a desktop computer roughly similar to a SPARCStation 5 workstation computer manufactured by Sun Microsystems, Inc. In other embodiments of the invention other types of computers could be used, including so-called, IBM PC compatible computers.

The computer system 30 includes an enclosure box 32. This box includes a metal chassis 29 (shown in simplified form in FIG. 1) which supports the components shown in FIG. 1 and a plastic enclosure box 31 (shown in cross-section in FIG. 1) which goes over that chassis. Inside the enclosure 32 is mounted a power supply 33 which converts standard alternating current power into the various direct current voltages needed by the computer's electronics.

Also inside the enclosure 32 is a motherboard 34 on which most of the computer's electronic components are mounted. These components includes a central processing unit, or CPU, 36 which communicates over a memory bus 38 with DRAM memory 40. The CPU can read from or write to this memory, and use it to store data or programs for controlling the operation of the CPU. In the preferred embodiment the CPU is a SPARC microprocessor with a high speed memory cache built in.

The CPU communicates with a plurality of other devices through a separate bus 42. The bus 42 is an SBus, a well known type of bus designed by Sun Microsystems, Inc. The other devices connected to the SBus include a serial I/O controller 44, a parallel and SCSI controller 46, and a special I/O controller 48, all of which are mounted on the mother board. The special I/O controller 48 is connected, among other things, to the computer's audio electronics 49, which are also mounted on the motherboard.

As is well known in the computing arts, the CPU 36 reads instructions from memory 40 and executes them. These instructions cause the CPU to read and write information from and to portions of the memory over the memory bus 38 and from and to other devices connected to the SBus 42. The serial I/O controller 44 receives inputs from a keyboard 54 and a mouse 56 and relays them to the CPU. It also controls, and transfers data to and from, a floppy drive 58. The parallel I/O controller is connected to a parallel port 60. It also contains a SCSI controller which controls, and transfers data to and from, SCSI devices which are connected to it. These include a CD-ROM drive 62 and a hard disk 64, both of which are mounted in the chassis of the computer's enclosure box 32. The SCSI controller is also connected to a connector 66 mounted on the motherboard at the back of the computer, where it can be accessed through a correspondingly shaped hole in the enclosure 32.

A graphics controller daughter card 50 is plugged into a multicontact connector 52, which connects it electronically to the SBus on the motherboard. The controller contains a connector 68 which also can be accessed through a hole in the back of the computer's enclosure. The graphics controller receives data representing screen images from the CPU and converts them into the signals necessary to generate corresponding images on the screen of the monitor 70.

Figure 2:
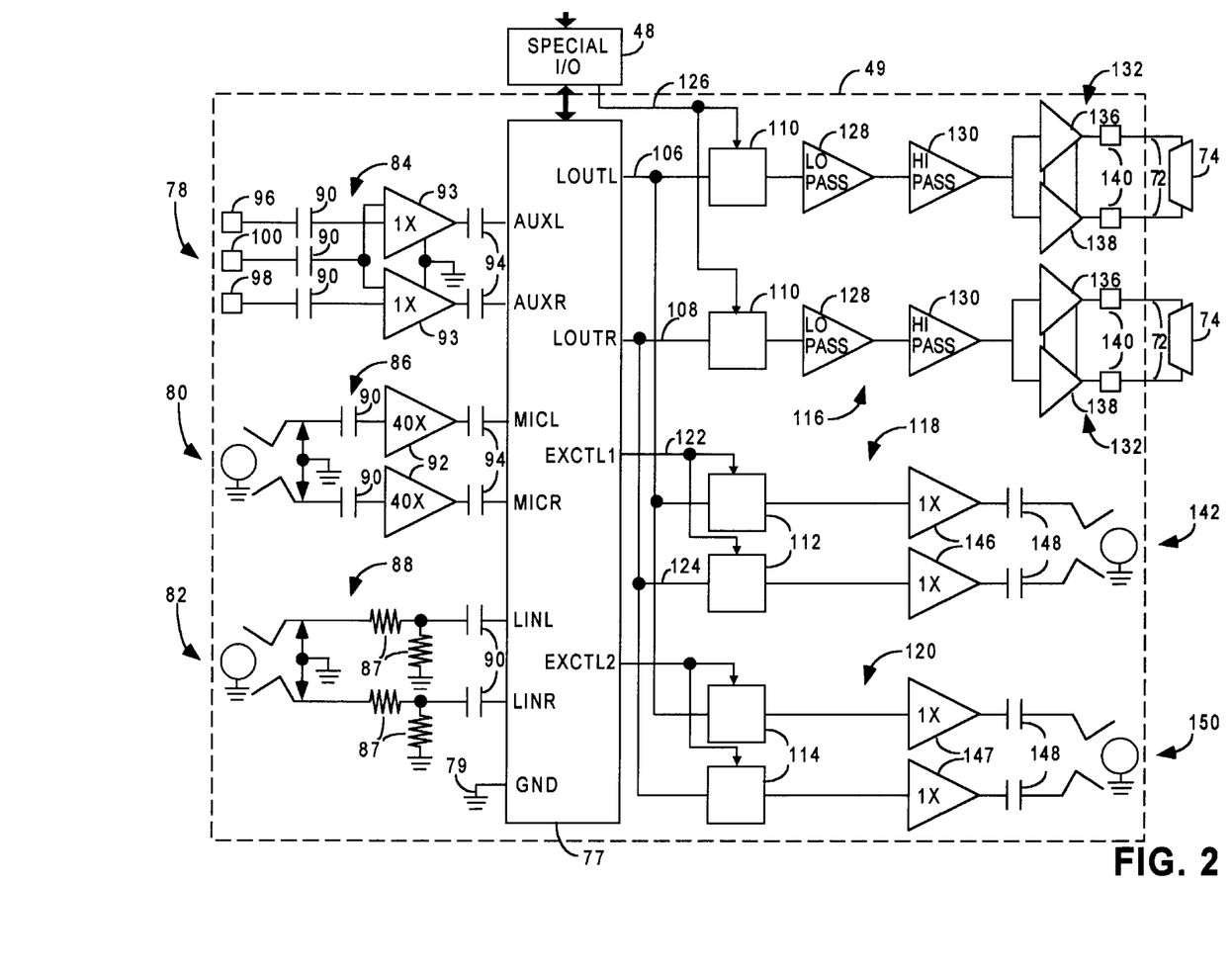
FIG. 2 is a simplified block diagram of the audio electronics of the computer system of FIG. 1.

FIG. 2 provides a more detailed diagram of the motherboard's audio electronics 49. These electronics are shown encircled in dotted-lines in that figure. They receive digital commands and data from, and send digital data to, the CPU 36 through the special I/O controller 48. Digital signals from the special I/O controller are supplied to a CODEC chip 77, which, in the embodiment shown, is a CS 4231 CODEC manufactured by Crystal Semiconductor, Inc., of Austin, Tex.

The CODEC chip 77 includes a stereo analog-to-digital converter within it. This converter receives as an input two stereo analog signals, and produces as an output two corresponding digital values representing, respectively, the magnitudes of the voltages of the two analog signals. It does this many thousands of times a second to produce a succession of digital values representing each of the analog signals over time. The computer's audio electronics include three analog stereo input connectors: a CD connector 78, a mike-in jack 80, and a line-in jack 82. Each of these connectors 78, 80, and 82 has a stereo analog signal path, 84, 86, and 88, respectively, connecting it to the CODEC. The CODEC chip includes multiplexing electronics for selectively switching the stereo signal on each such path to the input of the stereo analog-to-digital converter in response to digital commands supplied to the CODEC from the CPU through the special I/O controller 48.

The mike-in connector 80 is designed to receive relatively low voltage stereo analog inputs from stereo microphones, such as the stereo microphones 102, shown in FIG. 1. The line-in connector 82 is designed to receive higher voltage stereo signals from the outputs of other audio electronic equipment, such as the amplifier/tuner/tape player 104 shown in FIG. 1. The CD connector 78 is designed to receive analog stereo inputs from the CD-ROM drive 62 shown in FIG. 1. This CD-ROM drive can play CD-ROM data diskettes, supplying data read from such CD-ROM diskettes in digital form to the SCSI port on the parallel I/O controller 46 shown in FIG. 1. It can also play standard audio CDs, converting the digital information stored on such CD's into an analog stereo signal. It is this stereo analog signal which is supplied to the connector 78.

Each of the analog input signal paths 84, 86, and 88 is shown in a highly simplified form in FIG. 2. Each couples the left and right channel of its associated stereo input to an analog input of the CODEC chip through at least one pair of DC filtering capacitors 90, which filter out direct currents and very low frequencies from the signal supplied by its associated signal path to the CODEC chip 77.

The line-in signal path 88 connects the left and right channels received from the line-in jack to associated DC filtering capacitors 90 through voltage dividers. Each such voltage divider is formed of two equal resistors 87, one between the capacitor and the line-in jack, and one between the capacitor and ground. These voltage dividers cut in half the voltage of the signals supplied to the CODEC's LINL and LINR inputs. This decreases the chance that those signals will exceed the CODEC's input voltage limit, which would cause them to be audibly distorted.

The mike-in signal path 86 connects each of the stereo channels received from the mike-in jack to the input of an amplifier 92 through a DC filtering capacitors 90. Each of the amplifiers has a 40X voltage gain to boost the relatively small voltage signals produced by most microphones to signals having a voltage appropriate for use with the CODEC's analog-to-digital converter. Since each of the 40X amplifiers has an output centered about 2.5 volts, that output is connected to the MICL or MICR input of the CODEC chip through a capacitor 94, which removes the outputs 2.5 volt DC bias.

The CD signal path 84 starts with the connector 78, which has three contacts 96, 98, and 100, connected to a three wire cable (not shown in FIG. 2) from the CD-ROM drive 62. The contacts 96 and 98 receive the left and right stereo signals from the CD-ROM drive, respectively. Each of these signals is coupled through a DC filtering capacitor 90 to one input of an associated 1X amplifier 93. The connector 100 receives the ground voltage from the CD-ROM drive. It is coupled, through a DC filtering capacitor 90, to the other input of each of the two amplifiers 93. Each of the amplifiers 93 is connected to the local ground voltage 79 in the vicinity of the CODEC, and each produces as an output voltage variations equal to the variations of the voltage difference between its two input, defined relative to the CODEC's local ground voltage 79. The output of each of the amplifiers 93 is passed through a capacitor 94 to remove the 2.5 volt DC bias which results because the output of each such amplifier is centered about 2.5 volts.

The 1X amplifiers 93 are used in the CD signal path to ensure that the stereo signal it supplies to the CODEC has the same voltages relative to the CODEC's local ground 79 as the stereo signal generated by the CD-ROM drive had relative to that drive's local ground 63. This is necessary because the CODEC's analog-to-digital converter measures the voltages of its input signals relative to the CODEC's local ground 79. But the local ground 79 of the CODEC varies from that of the CD-ROM drive. This is because the CD-ROM drive is located at the other end of the computer from the CODEC and its local ground is connected to that of the CODEC's by multiple circuit paths formed by the computer's metal chassis 29. Both low and high frequency ground currents can be induced into these circuit paths by the operation of the computer's electronics, causing differences between the ground voltages at the CD-ROM drive and the CODEC. It is these differences which are filtered out by the amplifiers 93.

The CODEC chip 77 also includes within it a stereo digital-to-analog converter. This D/A converter receives two successions of digital values supplied from the CPU 36 through the Special I/O controller 48. These successive values represents the amplitudes of the audio signal in each of two stereo channels at successive periods times. It converts these successions of digital values into two analog signals having corresponding variations in voltage amplitude. The left channel of the resulting stereo analog signal is output by the CODEC chip on the LOUTL line 106. The right channel of that signal is output on the LOUTR line 108. The ground output for this stereo signal is connected to the local ground on the motherboard via the ground connector 79.

The stereo signal on the LOUTL and LOUTR lines is connected through three pairs of analog switches 110, 112, and 114 to a speaker stereo signal path 116, a headphone stereo signal path 118, and a line-out stereo signal path 120, respectively. These analog switches individually connect or disconnect the stereo signal produced at LOUTL and LOUTR from the signal paths 116, 118, and 120.

The analog switches 112, which connect or disconnect the headphone signal path 118 to LOUTL and LOUTR, are opened and closed by the first external control line of the CODEC chip, EXCTL1 122. The analog switches 114, which selectively connect or disconnect the line-out signal path 120 to LOUTL and LOUTR, are controlled by the second external control line of the CODEC chip, EXCTL2 124. The binary states of the EXCTL1 and EXCTL2 outputs are controlled by digital control signals the CPU sends the CODEC through the special I/O controller 48.

Since the CODEC chip only has two external control lines, EXCTL1 and EXCTL2, the two analog switches 110, which selectively connect the speaker signal path 116 to LOUTL and LOUTR, are controlled by an output 126 from the special I/O controller 48, which is set high or low by digital signals from the CPU.

Each of the two channels of the stereo analog speaker signal path 116 includes a low pass filter 128 and a high pass filter 130, a bridge mode drive amplifier 132, and wires 72 which connect the output of the drive amplifier to the channel's associated speaker 74. These speakers are mounted on the front of the computer's enclosure 32, as is shown in FIG. 1, behind a series of holes 76 provided to let the sound they produce more easily be heard outside the computer.

The low and high pass filters 128 and 130 in each channel of the speaker signal path function as equalization elements. They alter the frequency spectrum of the signals supplied to the channel's associated speaker 72 to compensate for the uneven frequency response of that speaker. This is done to make the sound produced by the speakers more pleasing. To save money, space, and weight, the speakers 72 are relatively small, inexpensive, speakers. As a result they do not reproduce sounds at the low end of the audible spectrum, frequencies in the range from sixty to several hundred hertz, nearly as loudly as they do frequencies in the mid-range of the audible spectrum centered around two to five thousand hertz.

Figure 3:
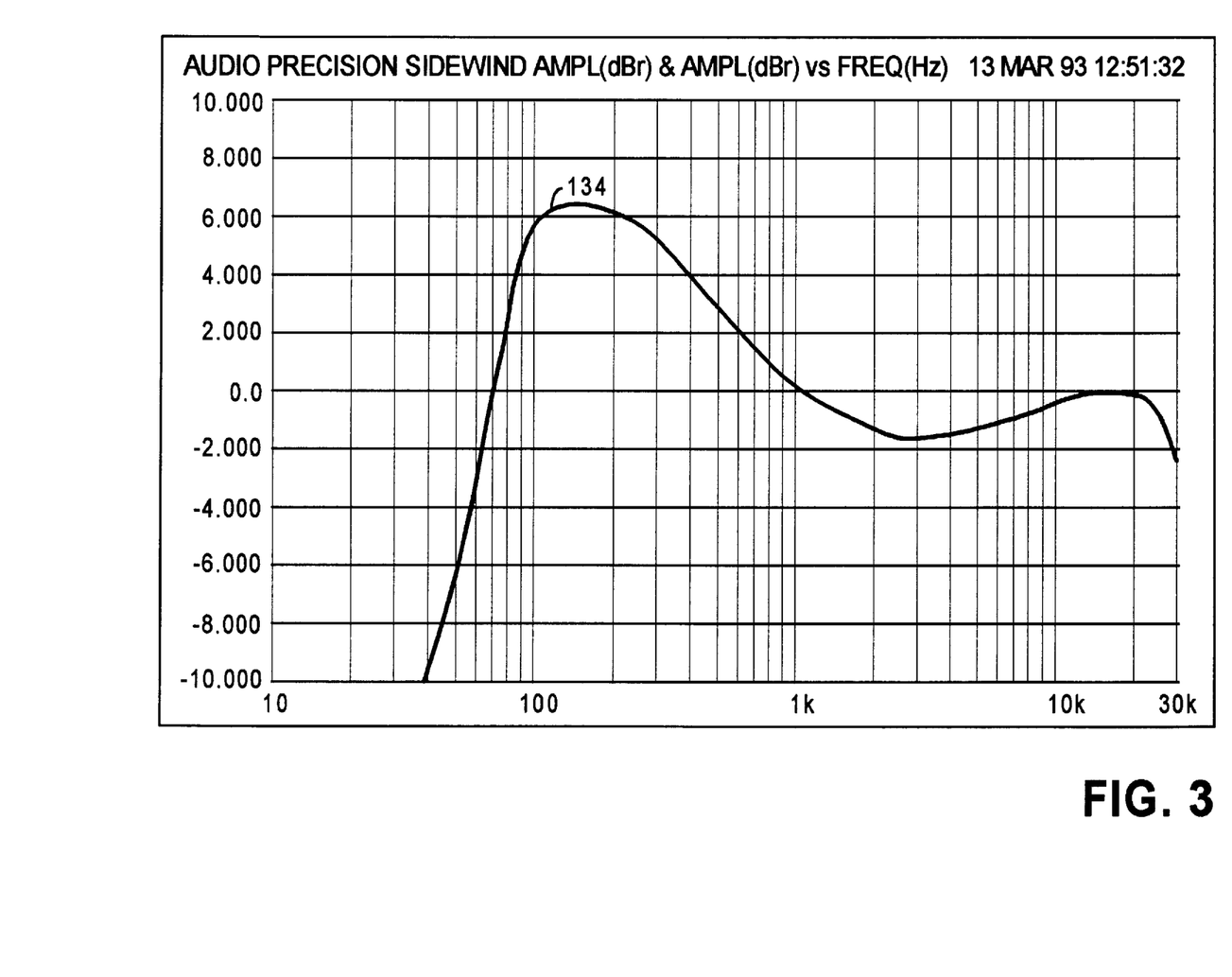
FIG. 3 is a graph of the equalization function performed on each of the analog signals supplied to the computer's stereo speakers.

To compensate for this lack, and to improve the sound of the system, the low and high pass amplifiers 128 and 130 alter the frequency spectrum of the analog signals supplied to the left and right speakers as indicated in the curve 134 shown in FIG. 3. In this graph the horizontal axis represents frequency of the signal in a logarithmic scale. The vertical axis represents in decibels the ratio of the amplitude of the signal supplied to the speakers to the amplitude of the signal on LOUTL or LOUTR.

As is indicated in FIG. 3, the low pass filter 128 boosts the low frequency end of the spectrum, that between sixty and one thousand hertz. This boost is as large as six decibels, or approximately four times the power, at approximately one hundred hertz. The high pass amplifier 130 increases the amplitude of frequencies near the high end of the audible range to compensate for the tendency of the low pass filter to decrease their amplitude, causing those high frequencies to have almost the same volume as if there were no equalization at all. Together, the low and high pass filters cause frequencies in the middle of the audible range, from approximately one thousand to ten thousand hertz, to have slightly less amplitude than they otherwise would. This is to compensate for the fact that the speakers 74 have their best frequency response in this middle range and would tend to make such frequencies too loud, giving a tinny sound, were it not for such equalization.

The equalized analog signal produced by the combination of the low and high pass filters 128 and 130 in each channel of the speaker signal path is supplied to the input of a bridge mode amplifier 132. The bridge mode amplifier amplifies this signal sufficiently to drive the channel's associated speaker 74. Each bridge mode amplifier consists of two ten volt amplifiers 136 and 138, each of which has a maximum output voltage swing between ground and plus ten volts. In each such amplifier approximately five volts represents an audio signal of zero amplitude. The bridge mode amplifier effectively doubles the voltage across each speaker by causing one of its two amplifiers to have an output above five volts proportional to the audio signal's amplitude and the other to have an output below five volts proportional to that amplitude. Thus, the difference between the outputs of these two amplifiers is twice as great as the difference between a single ten volt amplifier's output.

The outputs of the bridge mode amplifiers 136 and 138 of each channel are supplied to connectors 140 on the motherboard. The wires 72 which are attached to the speakers 74 are plugged in to these connectors.

The headphone stereo signal path 118 is selectively connectable to LOUTL and LOUTR through the analog switches 112 at one end. It is connected to a stereo output jack 142 at the other end. The jack can be used to connect this signal path to a pair of stereo headphones, such as the headphones 144 shown in FIG. 1. The headphone signal path includes an amplifier 146 on each of its two channels, the output of which is capacitively coupled to an associated one of the left and right signal contacts of the output jack 142. The amplifiers 146 have a 1X voltage gain, that is, their output has the same voltage variation as their input. But they are capable of driving much larger currents than the LOUTL and LOUTR outputs of the CODEC chip 77, as is necessary to drive the voltages produced at those outputs across the relatively low impedances commonly found in headphones. The capacitors 148 help to protect the headphone signal path from direct currents and remove any DC bias produced by the output of the amplifiers 146.

The line-out signal path 120 is selectively connectable at one end to the LOUTL and LOUTR lines through the analog switches 114. At the other end it is connected to a line-out jack 150. It is essentially similar to the headphone signal path 118 except that its amplifier's 147 are not designed to drive as much current as the amplifiers 146 in the headphone signal path. This is because the line-out jack is designed to supply signals to inputs of electronic devices, such as the amplifier/tuner/tape player 104 shown in FIG. 1, which normally have a much higher input impedance than headphones.

Those skilled in audio computing will appreciate that the audio electronics shown in FIGS. 1 and 2 enable stereo analog audio signals to be received either from microphones through the mike-in jack 80, from the output of an external electronic device through the line-in jack 82, or from the computer's CD-ROM drive. Under the control of digital signals sent from the CPU to the CODEC chip, the CODEC can select which of these analog inputs to convert into corresponding digital signals. These digital signals can be read by the CPU through the special I/O controller 48 and stored in the computer's memory 40. From there the CPU can cause these digital signals to be written by the CPU onto floppy disk, hard disk, or any other mass storage device connected to the computer's SCSI bus, such as a read-write optical disk.

Similarly the device can output audio by having the CPU read digital stereo signals from memory or from a mass storage device and write them through the special I/O controller 48 to the digital-to-analog converter on the CODEC chip 77. This causes a corresponding stereo signal to be produced at the chip's outputs LOUTL and LOUTR. The CPU can select which combination of the analog signal paths, that leading to the speakers 74, the headphone jack 142, or the line-out jack 150 will receive this stereo signal. The CPU's ability to choose which output signal path will receive the CODEC's analog output allows the user of the computer to selectively turn on and off its audio outputs under software control without the need to physically plug or unplug output devices. The fact that the computer's memory 40 can be loaded with different programs, which can control and use the computer's audio features in different ways, further increases the computers's flexibility as an audio device.

Figure 4:
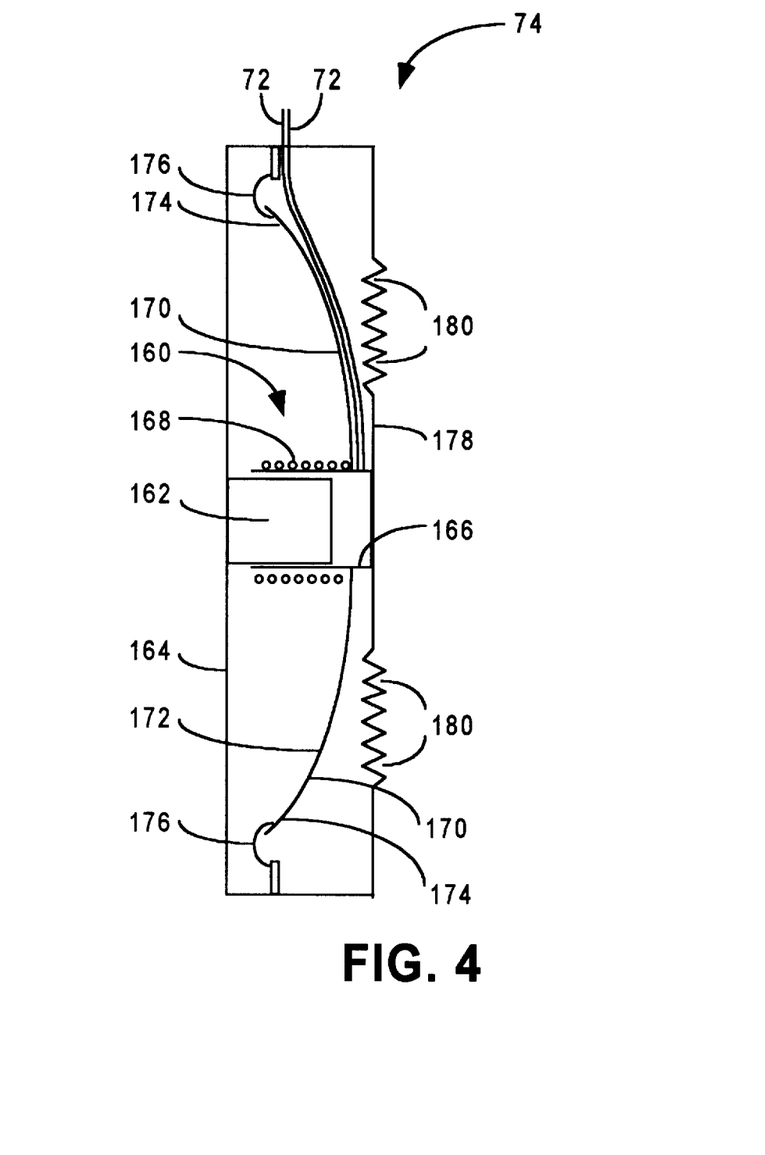
FIG. 4 is simplified cross-sectional representation of one of the low profile speakers used in the computer of FIG. 1.

FIG. 4 shows an inverted speaker 74 used with the embodiment of the invention shown in FIG. 1. This speaker has an electro-mechanical transducer 160 which is comprised of two portions. The first portion is a permanent magnet 162 in the shape of a cylinder mounted in the center of the speaker's front frame 164. The transducer's second portion includes a hollow cylindrical structure 166 made of a materials such as paper or plastic on which a wire coil 168 is wrapped. This coil is connected to the wires 72 connected to the output of the speaker's associated bridge mode amplifier 132. The coil and the hollow cylinder upon which it is wrapped are designed to slide in and out over the end of the permanent magnet 162 in response to variations in the electromagnetic field generated by that coil which variously attract or repel the permanent magnet.

The hollow cylinder 166 is attached near its end which faces away from the permanent magnet to the center of the speaker cone 170. The speaker cone is positioned so that its concave surface 172 faces the permanent magnet 162 and the front frame 164 upon which that magnet is mounted. Since the cone's front surface 172 is concave, its center, where the hollow cylinder 166 of the electromagnetic transducer is attached, is recessed relative to the cone's outer edges 174. These outer edges are attached to a circular flexible rubber strip 176, called a surround, which, in turn, is attached to the speaker's frame.

The front frame 164 of the speaker contains large openings through which sound waves generated by the motion of the speaker cone can travel. It also includes a fine screen to cover those openings to keep dust off of the front of the speaker cone and the electromagnetic transducer.

The back of the speaker is formed of a circular piece of sheet material 178, called a spider, which has circular folds 180. The spider is connected at its center to the hollow cylinder 166. It functions to help center the hollow cylinder 166 and the coil 168 around the axis of the cylindrical permanent magnet 162 and to help keep dust off the back of the speaker cone.

The speaker 74 is different from conventional speakers because it places the permanent magnet 162 and the coil 168 of its electromechanical transducer in front of its speaker cone, rather than behind it. By placing this transducer in the recess formed by the speaker cone's concave surface, the speaker saves space, enabling a speaker with a given cone and cone travel to be thinner. This is particularly important in computers where size is at a premium.

Figure 5:
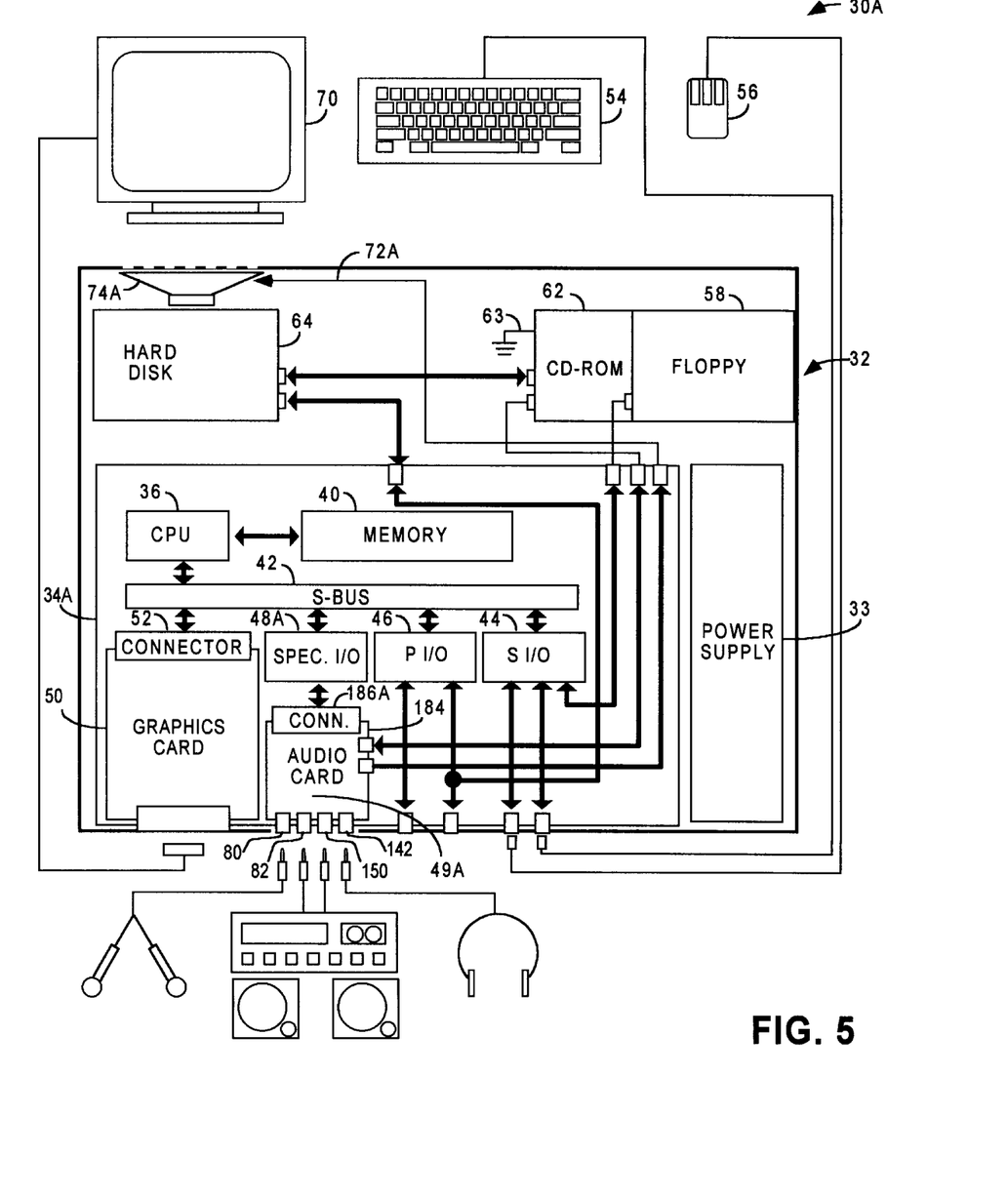
FIG. 5 is a schematic diagram of a computer system which is similar to that shown in FIG. 1, except its audio electronics are on a daughter card and it has only one speaker.
Figure 6:
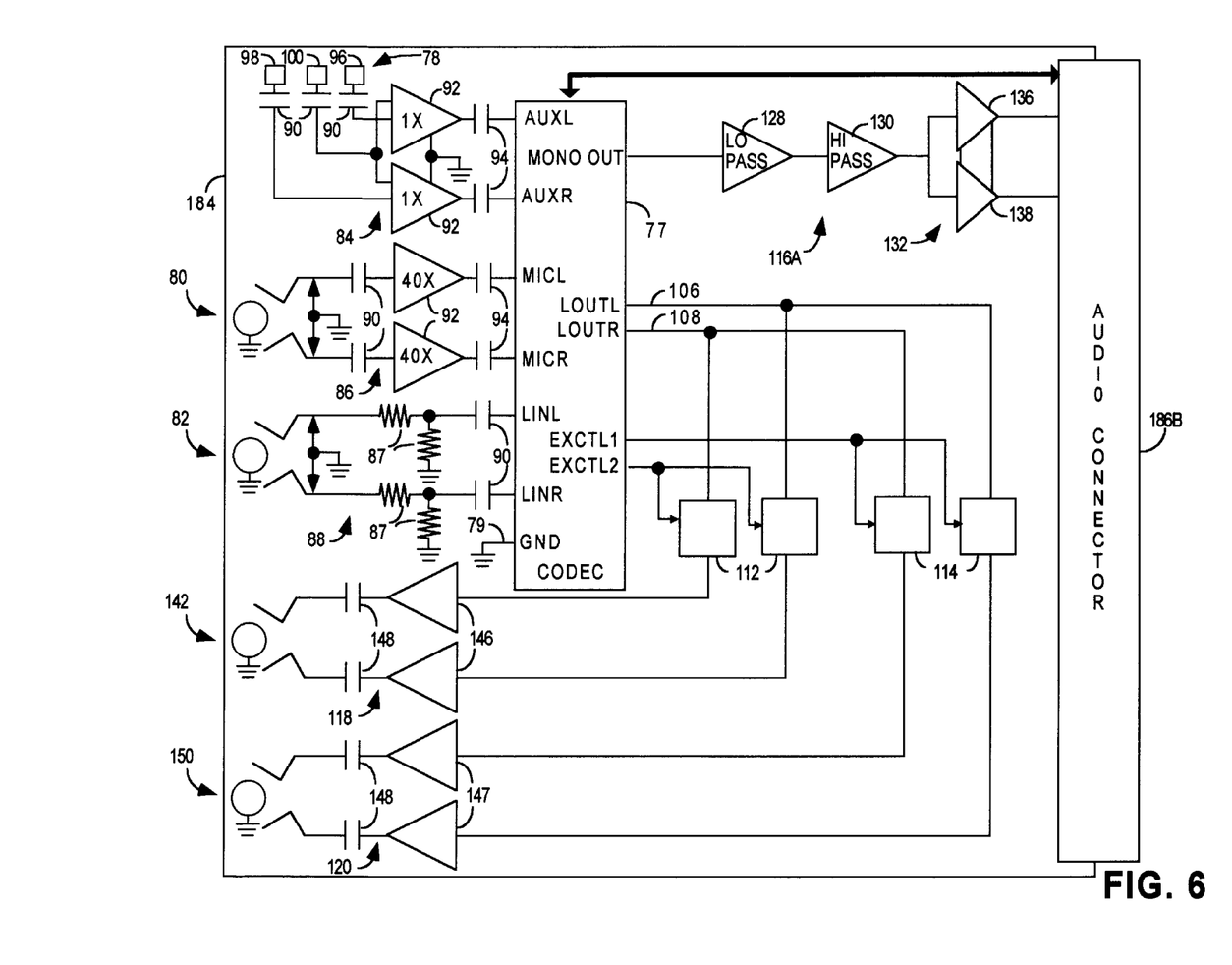
FIG. 6 is a simplified block diagram of the audio electronics on the daughter card of the computer system shown in FIG. 5.

FIG. 5 shows a computer system 30A which is identical to the system 30 shown in FIG. 1, except for the following differences illustrated in FIGS. 5 and 6.

First, it only has one speaker, a speaker 74A, instead of two, and it is a conventional speaker, that is, one with its electromagnetic transducer behind its speaker cone, rather than one, like that shown in FIG. 4, with its transducer in front of its cone.

Second, its audio electronics 49A are on a daughter board 184, rather than being on the system's motherboard 34A. The electronics on this daughter board are connected to those on the motherboard through a connector. This connector has two mating portions, a portion 186A which is part of the motherboard and a portion 186B which is part of the daughter board. The connectors 186A and 186B connects the CODEC 77 on the daughter board to the computer's special I/O controller 48A which is on the motherboard. It also connects the output of the bridge mode amplifier 132 in the daughter board's single speaker signal path 116A to a connector on the motherboard to which the wires 72A to the speaker 74A are connected. In addition, it connects power lines on the daughter board to those in the motherboard (neither of which are shown in the drawings).

Third, since the daughter board's speaker signal path 116A is monaural instead of stereo, it is connected to the MONO_OUT output of the CODEC chip 77. This output is produced by the CODEC chip through mixing the two analog outputs which the chip's stereo digital-to-analog converter supplies to LOUTL and LOUTR. The CODEC chip includes within it an analog switch on its MOUT_OUT output which is switched on and off by digital commands supplied to the CODEC chip from the CPU through the special I/O controller 48A. Thus, there is no need for an analog switch 110 external to the CODEC chip or a special control line 126 to control such an external analog switch, as is required in the embodiment of the invention shown in FIG. 2.

Finally, the mike-in connector 80, the line-in connector 82, the headphone out connector 142, and the line-out connector 150 are all mounted at the rear of the audio electronics card 184, position so that they can stick through an opening in the rear portion of the computer's enclosure when the daughter card's connector 186B is connected into the motherboard's connector 186A.

Having the computer's audio electronics on a separate card makes it possible to sell the computer 30A either with or without those electronics. In the preferred embodiment, the computer 30A is sold with the speaker 74A even if the audio card 184 is not included. This enables a user to add the audio card at a later time without the need to also install a speaker into the computer.

In an alternate embodiment of the invention which is not shown in the figures, the computer's audio electronics are placed on a daughter card 184 as shown in FIGS. 5 and 6. But in this alternate embodiment an SBus connectors is positioned parallel on the motherboard to the audio daughter card's connectors 186A and 186B. The SBus connector is taller than the audio card's connector, and it is position so that when an SBus card is connected to it, the SBus card will be parallel to, and above, the audio card. The card plugged into the SBus connector has a separate openings in the back of the computer, above that for the audio card, for supporting its other end and for allowing users easy access to input and output connectors located on that other end.

It should be understood that the forgoing descriptions and drawings are given merely to explain and illustrate the invention and that the invention is not to be limited thereto, except in so far as the interpretation of the appended claims are so limited. Those skilled in the art who have the disclosure before them will be able to make modifications and variations therein without departing from the scope of the invention.

For example, it should be understood that in other embodiments of the invention the computers used could be other than desktop computers. For example, they could be laptop or notebook computers. Similarly other embodiments of the invention could be made with different types of processors, such as concurrent processors or CISC processors.

Other embodiments of the invention might also use CODEC chips with different sets of features, or might even use analog-to-digital and digital-to analog converters which are separate components or which are integrated onto a processor or digital signal processor chip.

Similarly, it should be understood that in other embodiments the output of the CD-ROM produced when playing standard audio CDs could be a digital output supplied to a digital I/O controller, such as the parallel I/O controller 46 shown in FIG. 1, rather than the analog output supplied directly to the computer's audio electronics, as described above.

It should further be understood that in other embodiments the equalization element which compensates for the limited frequency response of the computer's speaker could be other than the combination of a low and high pass filter in the speaker signal path. For example, in some systems such equalization could be performed digitally by the CPU itself, or by a digital signal processing chip under the control of the CPU.

Accordingly, the invention is not to be limited to the specific embodiments illustrated and described, and the true scope and spirit of the invention are to be determined by reference to the following claims.

What I claim is:

1. A method of producing a computer with audio output comprising the steps of:

providing a computer enclosure;

providing programmable digital processing circuitry mounted in the enclosure;

providing digital memory mounted in the enclosure which can be read from and written to by the digital processing circuitry and which can store programs for controlling the digital processing circuitry and data;

providing digital-to-analog circuitry mounted in the enclosure, and connecting it to receive digital audio signals from the digital processing circuitry and to produce corresponding analog audio signals as an output;

providing a plurality of signal paths connected to the output of the digital-to-analog circuitry, each capable of receiving an analog audio signal produced by the digital-to-analog converter and delivering it to an associated output;

providing a speaker connected to the output of one of the signal paths;

providing an output jack connected to the output of another of the signal paths and providing an on/off device for enabling the digital processing circuitry to separately control whether or not an audio signal is supplied to the output of the signal path connected to said speaker and said output jack, respectively.

2. A method as in claim 1 further including the steps of:

providing a speaker connected to the output of a first of the signal paths;

providing an line-out jack connected to the output of a second of those signal paths; and providing a headphone jack connected to the output of a third of those signal paths;

wherein:

each of said first, second, and third signal paths have amplifying means with different amplification characteristics, so the amplification characteristics of said first second and third signal paths are suitable for driving said speaker, said line-out jack, and said headphone jack, respectively;

said speaker has poorer response at the low end of the audible spectrum in frequencies between sixty to several hundred hertz than it does in the mid-range of the audible spectrum centered around two to five thousand hertz;

said first signal path connected to said speaker has an equalization element in the enclosure for substantially altering the audible frequency spectrum of the analog signal received by the speaker relative to that of the digital audio signal received by the digital processing circuitry, by boosting the energy in that signal in said low end of the audible spectrum relative to that in said mid-range so as to compensate for the poorer response of said speaker in said low end; and said second and third signal paths supply analog signals to their respective output jacks without substantially altering the audible frequency spectrum of that signal relative to that of the digital audio signal received by the digital processing circuitry.

3. A computer comprising:

a computer enclosure;

programmable digital processing circuitry mounted in the enclosure;

digital memory mounted in the enclosure which can be read from and written to by the digital processing circuitry and which can store programs for controlling the digital processing circuitry and data;

digital-to-analog circuitry mounted in the enclosure and connected to receive digital audio signals from the digital processing circuitry and to produce corresponding analog audio signals as an output;

a plurality of signal paths connected to the output of the digital-to-analog circuitry, each capable of receiving an analog audio signal produced by the digital-to-analog converter and delivering it to an associated output; and a speaker connected to the output of one of the signal paths;

an output jack connected to the output of another of the signal paths and an on/off device for enabling the digital processing circuitry to separately control whether or not an audio signal is supplied to the output of the signal path connected to said speaker and said output jack, respectively.

4. A method of producing a computer with audio capabilities comprising the steps of:

providing a computer enclosure;

providing programmable digital processing circuitry mounted in the enclosure;

providing digital memory mounted in the enclosure which can be read from and written to by the digital processing circuitry and which can store programs for controlling the digital processing circuitry and data;

providing analog-to-digital circuitry mounted in the enclosure and connected to supply the digital processing circuitry digital audio signals representing analog audio signals supplied to the analog-to-digital circuitry;

providing a line-in jack;

providing an analog line-in signal path from the line-in jack to the analog-to-digital circuitry;

providing a mike-in jack;

providing an analog mike-in signal path from the mike-in jack to the analog-to-digital circuitry, including circuitry for amplifying a signal supplied to the mike-in jack before it is supplied to the analog-to-digital circuitry;

providing a digital-to-analog converter, mounted in the enclosure and connected to receive digital audio signals from the digital processing circuitry, such as the audio signals stored in the memory, for producing as an output analog audio signals corresponding to the digital analog signals received from the digital processing circuitry;

providing a speaker mounted in the enclosure providing an analog speaker signal path from the digital-to-analog converter to the speaker which includes amplification circuitry;

providing a headphone jack;

providing an analog headphone signal path from the digital-to-analog converter to the headphone jack which includes amplification circuitry;

providing a line-out jack;

providing an analog line-out signal path from the digital-to-analog converter to the line-out jack; and wherein the step of providing each of the speaker, headphone, and line-out signal paths includes providing in that path an analog switch which can be controlled by the digital processing circuitry for selectively electrically breaking or unbreaking that signal path.

5. A method as in claim 4 wherein:

said speaker, headphone, and line-out signal paths have amplifying means with different amplification characteristics, so the amplification characteristics of said speaker, headphone, and line-out signal paths are suitable for driving said speaker, said line-out jack, and said headphone jack, respectively;

said speaker has poorer response at the low end of the audible spectrum in frequencies between sixty to several hundred hertz than it does in the mid-range of the audible spectrum centered around two to five thousand hertz;

said speaker signal path has an equalization element in the enclosure for substantially altering the audible frequency spectrum of the analog signal received by the speaker relative to that of the digital audio signal received by the digital processing circuitry, by boosting the energy in that signal in said low end of the audible spectrum relative to that in said mid-range so as to compensate for the poorer response of said speaker in said low end; and said headphone and line-out signal paths supply analog signals to their respective output jacks without substantially altering the audible frequency spectrum of that signal relative to that of the digital audio signal received by the digital processing circuitry.

6. A method as in claim 4:

further including the step of providing a motherboard mounted in the enclosure; and wherein the steps of providing the digital processing circuitry, the analog-to-digital circuitry, the line-in and mike-in signal paths, the digital-to-analog circuitry, and the speaker, headphone, and line-out signal paths and their associated analog switches include mounting substantially all of the electronic components provided by those steps on the motherboard.

7. A method as in claim 4 further including:

a step of providing a motherboard upon which the digital processing circuitry is mounted, which motherboard contains an electrical connector for providing signal connections to the digital processing circuitry; and a step of providing a daughter board electrically connected to the digital processing circuitry on the motherboard through the connector;

wherein the steps of providing the analog-to-digital circuitry, the line-in and mike-in signal paths, the digital-to-analog circuitry, and the speaker, headphone, and line-out signal paths and their associated analog switches include mounting substantially all of their electronic components on the daughter board; and wherein the analog-to-digital circuitry, the digital-to-analog circuitry, and the analog switches are connected to the digital processing circuitry on the motherboard through the connector.

8. A computer comprising:

a computer enclosure;

digital processing circuitry mounted in the enclosure;

digital memory mounted in the enclosure which can be read from and written to by the digital processing circuitry and which can store programs for controlling the digital processing circuitry and data;

analog-to-digital circuitry mounted in the enclosure and connected to supply the digital processing circuitry digital audio signals representing analog audio signals supplied to the analog-to-digital circuitry;

a line-in jack;

an analog line-in signal path from the line-in jack to the analog-to-digital circuitry;

a mike-in jack;

an analog mike-in signal path from the mike-in jack to the analog-to-digital circuitry, including circuitry for amplifying a signal supplied to the mike-in jack before it is supplied to the analog-to-digital circuitry;

a digital-to-analog converter, mounted in the enclosure and connected to receive digital audio signals from the digital processing circuitry, such as the audio signals stored in the memory, for producing as an output analog audio signals corresponding to the digital analog signals received from the digital processing circuitry;

a speaker mounted in the enclosure;

an analog speaker signal path from the digital-to-analog converter to the speaker which includes amplification circuitry;

a headphone jack;

an analog headphone signal path from the digital-to-analog converter to the headphone jack which includes amplification circuitry;

a line-out jack;

an analog line-out signal path from the digital-to-analog converter to the line-out jack; and wherein each of the speaker, headphone, and line-out signal paths includes an analog switch which can be controlled by the digital processing circuitry for selectively electrically breaking or unbreaking that signal path.

9. A computer as in claim 8 wherein said speaker, headphone, and line-out signal paths each have amplifying means with different amplification characteristics, so the amplification characteristics of said speaker, headphone, and line-out signal paths are suitable for driving said speaker, said line-out jack, and said headphone jack, respectively;

said speaker has poorer response at the low end of the audible spectrum in frequencies between sixty to several hundred hertz than it does in the mid-range of the audible spectrum centered around two to five thousand hertz;

said speaker signal path has an equalization element in the enclosure for substantially altering the audible frequency spectrum of the analog signal received by the speaker relative to that of the digital audio signal received by the digital processing circuitry, by boosting the energy in that signal in said low end of the audible spectrum relative to that in said mid-range so as to compensate for the poorer response of said speaker in said low end; and said headphone and line-out signal paths supply analog signals to their respective output jacks without the alteration to the audible frequency spectrum provided by said equalization element.

10. A computer as in claim 8:

further including a motherboard mounted in the enclosure; and wherein substantially all of the electronic components of the digital processing circuitry, the analog-to-digital circuitry, the line-in and mike-in signal paths, the digital-to-analog circuitry, and the speaker, headphone, and line-out signal paths and their associated analog switches are mounted on the motherboard.

11. A computer as in claim 8 further including:

a motherboard upon which the digital processing circuitry is mounted, which motherboard contains an electrical connector for providing signal connections to the digital processing circuitry; and a daughter board electrically connected to the digital processing circuitry on the motherboard through the connector;

wherein substantially all of the electronic components of the analog-to-digital circuitry, the line-in and mike-in signal paths, the digital-to-analog circuitry, and the speaker, headphone, and line-out signal paths and their associated analog switches are mounted on the daughter board; and wherein the analog-to-digital circuitry, the digital-to-analog circuitry, and the analog switches are connected to the digital processing circuitry on the motherboard through the connector.

12. A computer comprising:

a computer enclosure;

digital processing circuitry mounted in the enclosure;

digital memory mounted in the enclosure which can be read from and written to by the digital processing circuitry and which can store programs for controlling the digital processing circuitry and data;

analog-to-digital circuitry mounted in the enclosure and connected to supply the digital processing circuitry with digital representations of analog audio signals supplied to the analog-to-digital circuitry, said analog-to-digital circuitry having a signal input for receiving an analog signal, and a ground input for receiving the local ground voltage in the vicinity of said analog-to-digital circuitry;

a stereo media drive mounted in the enclosure, for reading information stored on an information storage media and generating a stereo analog signal representing that stored information, said drive having a ground input for receiving the local ground voltage in the vicinity of the media drive, and said drive producing its analog signal on three conductors, including two signal conductors for transmitting the variable voltages of the analog signal of each of two stereo channels and a ground conductor for transmitting the local ground voltage supplied by the drive's ground input;

two differential amplifiers, one for each of said stereo channels, each of said amplifiers having a ground input connected to the analog-to-digital circuitry's local ground voltage and each having two analog inputs, said amplifier producing an analog output, defined relative to the analog-to-digital circuitry's local ground, which is proportional to the voltage difference between its inputs;

a first capacitor coupling a first of said two signal conductors from the media drive to one input of a first of said differential amplifiers;

a second capacitor coupling a second of said two signal conductors from the media drive to one input of a second of said differential amplifiers;

a third capacitor coupling the ground conductor from the media drive to the other inputs of the first and second differential amplifiers; and a signal path for supplying an analog signal corresponding to the output of the differential amplifier to the analog-to-digital circuitry.

\* \* \* \* \*